May 9, 1967 T. C. LAM 3,319,186
ADJUSTABLE CRYSTAL OSCILLATOR WITH SEPARATE FEEDBACK AMPLIFIER
Filed Oct. 14, 1965
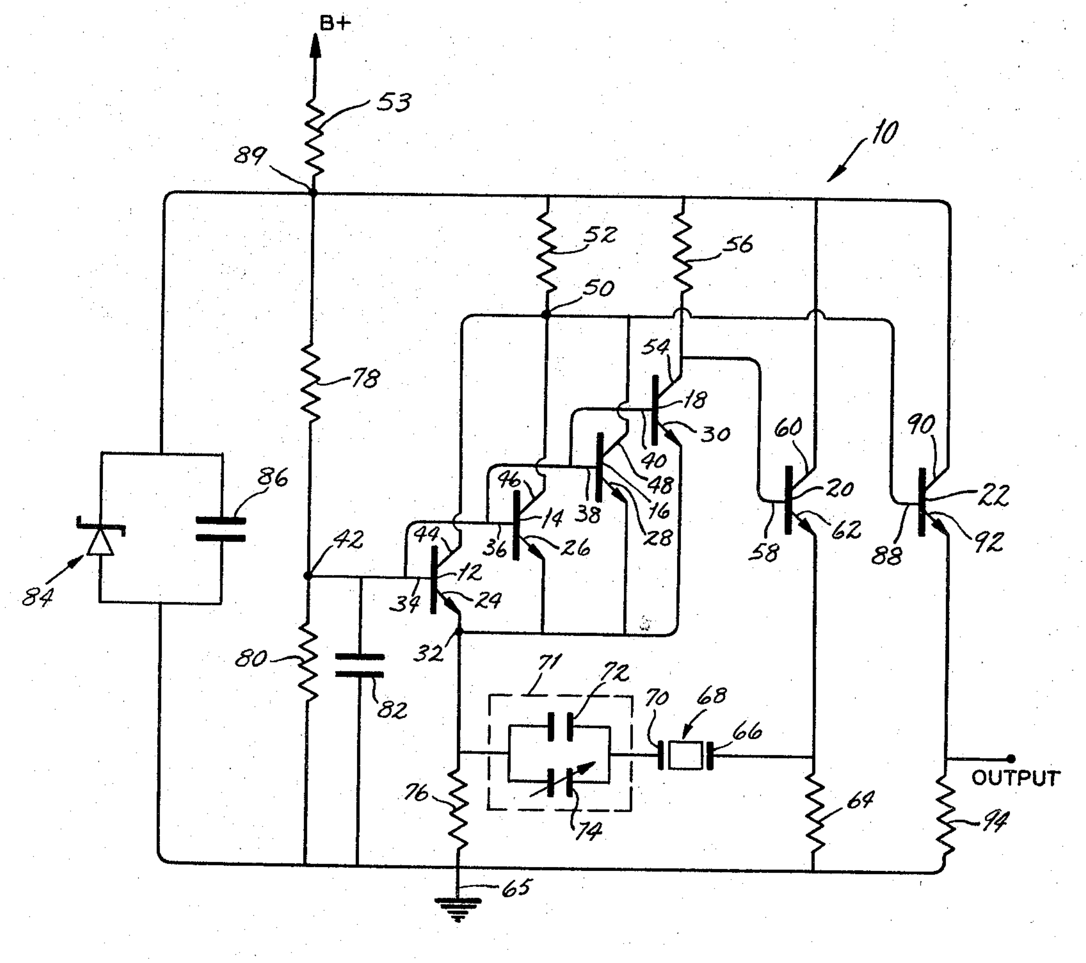
INVENTOR
TAT C. LAM
BY [signature]
ATTORNEY 3,319,186

ADJUSTABLE CRYSTAL OSCILLATOR WITH SEPARATE FEEDBACK AMPLIFIER

Tat C. Lam, Brentwood, Mo., assignor to Monsanto Company, St. Louis, Mo., a corporation of Delaware Filed Oct. 14, 1965, Ser. No. 495,817
8 Claims. (Cl. 331—116)

The present invention relates generally to transistorized oscillators, and more particularly to a transistor-driven crystal oscillator, wherein the signal generated by the crystal is amplified and an amplified portion thereof used to drive the crystal for sustained operation.

Heretofore, when an increased output from a conventional crystal oscillator was desired, the feedback signal used to drive the crystal was likewise increased. This driving of the crystal at a substantially higher power level often resulted in undesired aging and stability problems. Furthermore, phase shifting and frequency variations oftentimes resulted.

The general purpose of this invention is to provide a crystal oscillator which posseses the advantages of similarly employed oscillators, but which does not possess the aforedescribed disadvantages. To attain this, the present invention utilizes a unique feedback circuit which feeds back only a predetermined portion of the amplified signal and isolates the feed-back oscillation loop, including the sensitive crystal, from the oscillator output.

Therefore, among the objects of the present invention are the provisions of a crystal oscillator which provides an increased output signal, and yet drives the crystal at a relatively low power drive level.

Another object is to provide a crystal oscillator in which only a predetermined portion of the amplified output signal is fed back to drive the frequency-determining crystal.

A further object of the invention is the provision of a crystal oscillator which provides effective isolation between the output of the oscillator and the oscillation feedback loop.

In the present invention these purposes (as well as others apparent herein) are achieved generally by providing amplifying transistors each having emitter, collector, and base electrodes. The emitter electrodes of the amplifying transistors are connected together and serve as input terminals for signals which are provided by a frequency-determining piezoelectric crystal. At least one of the transistors is employed as a feed-back amplifier to amplify the oscillation signal and feed it back through an emitter-follower stage to drive the crystal. The oscillator output is taken from the transistor which is not used to feed-back the crystal-driving signal. Its collector is electrically remote and isolated from the feedback transistor.

Utilization of the invention will become apparent to those skilled in the art from the disclosures made in the following description of a preferred embodiment of the invention, as illustrated in the accompanying drawing, in which:

The single figure of the drawing shows a schematic diagram of one form of the crystal oscillator of the present invention.

Referring now to the single figure of the drawing, there is shown a transistorized oscillator, generally designated 10 which embodies the present invention. The transistorized oscillator 10 includes six NPN transistors 12, 14, 16, 18, 20 and 22, each having base, emitter and collector electrodes. The transistors 12, 14, 16, and 18 are substantially identical and serve as amplifying transistors. They have their respective emitter electrodes 24, 26, 28, and 30 connected together at a common terminal 32. Similarly their respective base electrodes 34, 36, 38 and 40 are connected together at a common terminal 42. By this manner of tying the respective emitters and bases together, the same emitter-base potential established between the terminals 32 and 42 is applied to each of the transistors 12, 14, 16, and 18. The collector electrodes 44, 46, and 48 of the transistors 12, 14, and 16 respectively are connected together at common terminal 50. The common terminal 50 is coupled to a source of positive potential B+ by means of a load resistor 52 and a current limiting resistor 53. It should be noted that the resistor 52 serves as a common load resistor for the transistor 12, 14 and 16 and does not influence the operation of the transistor 18.

The collector electrode 54 of the feed-back transistor 18 is coupled to the source of positive potential B+ through a load resistor 56 and the current limiting resistor 53. In the preferred embodiment of the present invention the load resistors 52 and 56 are chosen to have approximately the same resistive value, and the amplifying transistors 12, 14, 16 and 18 have identical operating characteristics. Since the same operating potentials are applied to the emitter-base electrodes of all of the amplifying transistors and they are identical, the current which will flow from the B+ power supply and in the collector-electrodes of each of the amplifying transistors 12, 14, 16 and 18 will be approximately equal.

It should be noted that, by providing feed-back transistor 18 with its own separate load resistor 56, the collector 54 thereof is substantially electrically remote and isolated from the collector electrodes 44, 46, and 48 of the "ganged" amplifying transistors 12, 14 and 16.

The collector electrode 54 of the transistor 18 is connected to the base electrode 58 of the transistor 20 and serves to present a high impedance to the collector 54 and a low impedance to the frequency-determining crystal, to be described hereinafter. That is, the transistor 20 is connected to operate in its emitter-follower mode by having its collector electrode 60 connected to the B+ power supply and its emitter electrode 62 connected to a load resistor 64, which in turn is connected to ground potential 65 or some other reference potential. The emitter electrode 62 which serves as the output terminal of the emitter-follower transistor 20 is also connected to one terminal 66 of a frequency-determining piezoelectric crystal, generally designated 68. The other terminal 70 of the piezoelectric crystal 68 is connected to a variable capacitive network, indicated by the dashed line 71. This network 71 consists of a first capacitor 72 of fixed capacitance and a variable capacitor 74. The variable capacitive network 71 is connected to the common terminal 32 and a biasing resistor 76.

As will be more apparent from the following description of the operation of the crystal oscillator 10, the emitter-follower transistor 20, the piezoelectric crystal 68, and variable capacitive network 71 serve as an oscillation feedback loop. That is, a signal applied to common terminal 32 will be amplified by feed-back transistor 18 and fed back via the collector electrode 54 through the emitter-follower transistor 20 to be applied to the piezoelectric crystal 68. This amplified feedback signal is used to drive the piezoelectric crystal 68 in its series-resonance mode of operation so that it in turn will generate a signal of predetermined frequency to the common terminal 32. In so doing, sustained oscillations will be provided.

A biasing network is provided to establish the appropriate operating level of the amplifying transistors 12, 14, 16, and 18. This biasing network includes a voltage divider consisting of resistors 78 and 80 connected between the B+ power supply and ground. The resistors 78 and 80 are connected together at the common terminal 42 so that the proper operating potential is applied to the common bases 34, 36, 38 and 40 of the transistors. A by-pass capacitor 82 is provided in shunt with the voltage divider resistor 80 in the conventional manner.

In order to assure that the operating potentials supplied to the transistorized oscillator 10 are independent of changes in the B+ power supply, a Zener diode 84 having a by-pass capacitor 86 in shunt therewith is connected between the B+ power supply and ground. In this manner a constant voltage may be maintained between the point 89 and ground regardless of slight voltage changes at the B+ power supply.

Although the common terminal 50 may serve as the output terminal for the transistorized oscillator 10, it is oftentimes preferable to provide an emitter-follower output stage. Such a stage is illustrated as comprising the transistor 22 and its load resistor 94. As shown, the base electrode 88 of the transistor 22 is connected to the terminal 50 and its collector electrode 90 is coupled to the B+ power supply. Where such an emitter-follower output stage is employed, the emitter electrode 92 serves as the output terminal for the transistorized oscillator 10.

In operation, when the B+ power supply is applied to the transistorized oscillator circuit 10 of FIG. 1, the piezoelectric crystal 68 will be excited and generate a relatively low magnitude signal which will have a frequency determined by the inherent crystal structure and the value of the capacitors 72 and 74. The variable capacitive network 71 is provided to vary this basic frequency of the crystal 68 by the amount desired. For example, in precision instruments where an exact clock frequency is required, the capacitor 72 serves as a coarse adjustment and the variable capacitor 74 serves as a fine adjustment for the frequency of the signal generated and applied to terminal 32. This generated, precise-frequency signal influences all of the transistors 12, 14, 16 and 18 in the same manner. That is, one-fourth of the total available current flows in the collector paths of each of the amplifying transistors. The output voltage of the transistorized oscillator 10 which appears at common terminal 50 and emitter electrode 92 is approximately three times as great as the feedback voltage which appears at the collector electrode 54 of transistor 18. Thus, it should be apparent that the power-drive level of the crystal 68 is substantially reduced by this unique method of feeding back a portion of the increased oscillator output voltage.

Thus, in feeding back only a portion of the amplified signal to drive the oscillator crystal 68, it is possible to obtain an increased output signal and yet drive the crystal at a relatively low power level. This insures optimum aging and stability of the transistorized oscillator 10. In addition improved isolation between the oscillator output circuit and the oscillation feedback loop is obtained because the grounded base feedback amplifier 18 and emitter-follower 20 are inserted in circuit between the output terminal 50 and the crystal 68.

Obviously many modifications and variations of the present invention are possible in view of the above teachings. Therefore, it is to be understood that the invention may be practiced otherwise than as specifically described.

I claim:

1. A crystal oscillator, comprising
a plurality of amplifying transistors each having emitter, collector and base electrodes, said respective base and respective emitter electrodes being connected together,
a feed-back circuit including
a frequency-determining crystal connected in series circuit between said collector electrode of at least one of said amplifying transistors and said connected-together emitter thereof, the other of said collector electrodes being connected together and serving as a common output terminal for said oscillator,
together with
means to supply operating potentials to said base and collector electrodes of said plurality of transistors,
whereby a predetermined portion of the amplified oscillation signals isolated from said oscillator output signal may be fed back to drive said frequency-determining crystal.

2. The crystal oscillator as defined in claim 1, further characterized by
said feed-back circuit including
an additional transistor having base, emitter, and collector electrodes, and
means to supply operating potentials to said collector and emitter electrodes of said additional transistor, thereby to operate it in its emitter-follower mode of operation.

3. The crystal oscillator as defined in claim 2, wherein said operating potential supply means includes
a resistive voltage divider network,
a power supply, and
means connected in shunt across said voltage divider network to provide a substantially constant voltage thereacross,
whereby the operation of said crystal oscillator is substantially unaffected by changes in said power supply.

4. The crystal oscillator as defined in claim 3, wherein said last mentioned means is a zener diode.

5. A crystal oscillator, comprising
a plurality of transistors each having emitter, collector, and base electrodes, said emitter electrodes all being connected together and serving as inputs for signals to be amplified by said plurality of transistors,
means to supply operating potentials to said base and collector electrodes of said plurality of transistors,
an oscillation feed-back loop including
a frequency-determining piezoelectric crystal connected in series with the emitter and collector electrodes of at least one of said plurality of transistors, whereby said one of said transistors provides a driving signal to said frequency-determining crystal;
said frequency-determining crystal being connected to apply its generated signal to said emitter electrodes of the other of said plurality of transistors,
said collector electrodes of the other of said plurality of transistors being connected together electrically remote and substantially electrically isolated from said oscillation feed-back loop, thereby to provide the output signal from said oscillator,
whereby the oscillator may be operated at high output signal levels with relatively low driving signals being supplied to said oscillation feed-back loop.

6. A crystal oscillator, comprising
first and second amplifying transistors each having emitter, collector, and base electrodes, said emitter electrodes being connected together and serving as input terminals for signals to be amplified by said transistors,
means to supply operating potentials to said base and collector electrodes of said transistors,
an oscillation feed-back loop including
a frequency-determining piezoelectric crystal connected to receive a driving signal from the collector of said first transistor, said frequency-determining crystal further being connected to apply its generated signal to said emitter electrode of said second transistor,
said collector electrode of said second transistor being electrically remote and substantially electrically isolated from said oscillation feed-back loop, thereby to provide the output signal from said oscillator,
whereby such output signal is substantially isolated from said oscillation feed-back loop.

7. A crystal oscillator comprising
first and second grounded base transistors each having emitter, collector and base electrodes, said emitter electrodes being coupled together and serving as input terminals for an input signal to be amplified thereby,
an oscillation feed-back loop including
a frequency-determining piezoelectric crystal connected in series with the emitter and collector electrodes of said first transistor, a third transistor connected to take its input from said collector electrode from said first transistor and operating in the emitter follower mode, said third transistor being further connected to said piezoelectric crystal to supply a driving signal thereto and present it with a low input impedance, means to supply operating potentials to said first, second, and third transistors, and said collector electrode of said second transistor being electrically remote and substantially electrically isolated from said collector electrode of said first transistor, thereby to provide the output signal from said oscillator, whereby said third transistor serves to further isolate said piezoelectric crystal from said oscillator output.

8. A crystal oscillator, comprising a group of four amplifying transistors each having emitter, collector, and base electrodes, said emitter electrodes all being connected together and serving as a common input terminal for signals to be amplified by each of said transistors, an oscillation feed-back loop including a frequency-determining piezoelectric crystal, a transistor having emitter, collector and base electrodes, said transistor being connected as an emitter-follower and having its base electrode connected to the collector electrode of one of said amplifying transistors and its emitter electrode connected to drive said piezoelectric crystal, and a variable capacitive network connected between said piezoelectric crystal and said common emitter electrodes of said amplifying transistors, whereby the series-resonance frequency of said oscillation feed-back may be adjusted, and means to supply operating potentials to said amplifying transistors and said emitter-follower transistor, said collector electrodes of the other three of said amplifying transistors being connected together electrically remote and substantially isolated from said collector electrode of the remaining amplifying transistor.

References Cited by the Examiner

UNITED STATES PATENTS

| | | | |
|---|---|---|---|
| 2,912,654 | 11/1959 | Hansen | 331—117 |
| 3,134,947 | 5/1964 | Charasz | 331—116 X |

ROY LAKE, *Primary Examiner.*

S. H. GRIMM, *Assistant Examiner.*